United States Patent [19]

Carlsen, II et al.

[11] Patent Number: 5,025,473

[45] Date of Patent: Jun. 18, 1991

[54] HEMISPHERICAL SPEAKER SYSTEM

[76] Inventors: George D. Carlsen, II, 1145, Sea Village Dr., Cardiff, Calif. 92007; Ronald W. Vale, 416 W. San Ysidro Blvd., Suite L612, San Ysidro, Calif. 92073

[21] Appl. No.: 399,236

[22] Filed: Aug. 24, 1989

[51] Int. Cl.[5] ........................ H04R 1/02; H04R 25/00; H05K 5/00

[52] U.S. Cl. ........................................ 381/88; 381/89; 381/90; 381/205; 181/148

[58] Field of Search ...................... 381/88, 89, 90, 186, 381/188, 205; 181/144, 148, 153

[56] References Cited

U.S. PATENT DOCUMENTS

| | | | |
|---|---|---|---|
| 4,179,585 | 12/1979 | Herrenschmidt | 381/90 |
| 4,231,446 | 11/1980 | Weiss et al. | 181/148 |
| 4,673,057 | 6/1987 | Glassco | 181/144 |
| 4,837,826 | 6/1989 | Schupbach | 381/90 |

FOREIGN PATENT DOCUMENTS

| | | | |
|---|---|---|---|
| 0224998 | 12/1984 | Japan | 381/186 |

*Primary Examiner*—Jin F. Ng
*Assistant Examiner*—Jason Chan
*Attorney, Agent, or Firm*—Charles C. Logan, II

[57] ABSTRACT

An arrangement of divergently mounted acoustic transducers in a hemispherical air tight enclosure, the enclosure being sized with regard to the loading requirements of the acoustic transducers to produce a small size speaker system having an omnidirectional sound radiation pattern and a flat frequency response without the need of a crossover network. The hemispherical enclosure being comprised of six flat equal sided pentagonal plates, five triangular shaped flat gussets and a flat base plate all of which when assembled forms a half dodecahedron polyhedron shaped enclosure with a closed base, with the base serving as the enclosure mounting surface.

4 Claims, 1 Drawing Sheet

HEMISPHERICAL SPEAKER SYSTEM

BACKGROUND OF THE INVENTION AND PRIOR ART

The present invention relates to sound reproduction but particularly to a plurality of speakers arranged in a divergent pattern to approximate a hemisphere in order to disperse sound equally in all directions.

Prior art has taken many forms in an effort to reproduce faithfully and to direct sound waves successfully to the listener where ever he may be in the listening area and to eliminate dead spots or areas of sound wave cancelation. From basic driver and horn combinations to cabinets with multiple drivers, special crossover networks and tuned ports with baffled internal structures the designer has attempted to create an infinite acoustic baffle around the speaker driver elements in order to extend frequency band width and to reduce distortion to a minimum. The introduction of the accoustic suspended speaker system in which the speaker is sealed in a cabinet without ports has proved to be superior to the ported types in bandwidth but is somewhat less efficient. All of the afore mentioned systems reproduce sound as a wave front which radiates from the speaker face and must be directed toward the listener. This directional effect can lead to wave front cancelations or dead spots in the listening area caused by reflections from walls and furniture.

Two speakers placed back to back in a sealed container and excited in phase as shown by manger in U.S. Pat. No. 4,268,719 create an infinite baffle which is in the form of a plane parallel to and located between the two speakers. The distribution of sound from this combination more closely resembles an omnidirectional wave pattern which is less subject to reflection problems. Taking this approach further, more speaker elements may be included into different patterns such as those described by glassco in U.S. Pat. No. 4,673,057 in which a number of similar speakers are arranged so that each maintains a common angle of divergence with its adjacent speakers. It is apparent that if the number of speakers continued to increase in this system eventualy a sphere would be formed which would have nearly perfect omnidirectional radiation qualities. In an effort to produce a speaker system which has the maximum frequency response and best omnidirectional pattern one is forced to use as big a speaker as possible for the low frequency response and to add tweeter units to extend the upper frequency response and to use as many speakers in the design as is economical. The tradeoffs all considered, the dodecahedron seems to be the closest to the desired shape. However, a system of this shape using twelve standard eight inch woofers and twelve small tweeters weighs in at about one hundred pounds. This is a considerable weight to hang from a ceiling and is an awkward form to transport from place to place. Use of such a speaker system in a car or van would be impossible or at least impractical and two are required for stereo sound. Bisecting the dodecahedron on its equatorial plane as described by glassco to produce a stereo system limits its installation in a listening room to the middle of the room or to the middle of the ceiling which is not always possible.

SUMMARY OF INVENTION

The present invention provides an arrangement of acoustic transducers which produces a loudspeaker system. This arrangement includes a plurality of identical transducers divergently mounted in an air tight frame which takes the shape of a hemisphere with its base closed which serves also as its mounting surface. This arrangement provides an omnidirectional sound radiator which can be mounted on a wall, a ceiling or positioned anywhere on the floor of the listening room. The prefered embodiment of the invention is formed by dividing a dodecahedron 12 sided polyhedron into two equal halves by cutting it through its equatorial plane and providing a suitable base to enclose the open face thus producing a near hemespherical structure. Actually the equitorial cut follows a zig zag pattern leaving a series of triangular teeth which can be filled in by triangular cut gussets to form a smooth base edge for attachment to a base plate. The construction of the prefered embodiment is simplified in that the structural components which have three distinct shapes are all cut from the same flat sheet material. The hemispherical portion of the structure is formed of six equal-sided pentagonal pieces each having a circular hole cut at its center which holds the acoustic transducer. The five outside edges of the pentagonal pieces are angled with respect to their flat surface so that when assembled together to form a hemisphere adjacent edges meet at a common surface. The open base formed by assembly of the pentagonal pieces produces a sawtooth edge with five teeth. The teeth are filled with triangular cut gussets cut from the same material as the pentagonal pieces. The gussets also have the same angle cut on two edges with respect to their flat surfaces as do the pentagonal pieces in order to mate with the pentagonal pieces, also additionally they have a second angle cut on the remaining edge which mates with the base plate. The base plate is also cut from the same material as the previous described components. The base plate can take any desired shape for asthetic or functional purposes.

An object of this invention is to provide the acoustic transducers with the proper acoustic loading and to afford the transducer some physical damping protection against excessive applied electrical transient pulses. This is accomplished by first determining the electrical current to force transfer function of the acoustic transducer. This is done by placing known weights on the cone of a transducer positioned face up and measuring the electrical current required at its input terminals to displace the added weight a known amount. The range of cone linear displacement is also determined using this technique. The total displacement and the corresponding force is multiplied by the number of transducers in the system and is used to determine volume of the hemespherical enclosure. Once installed and sealed in the enclosure, the transducers are protected from excessive transient displacement by the back pressure caused by compression or rarefication of the air in the enclosure. The above proceedure eliminates the need to cut ports in the enclosure since it is sized to match the transducers it contains.

A study of various construction materials has shown that harder materials such as cast aluminum and glass filled epoxy produce a frame which is too stiff. The effect is that the structure has a self-resonant period. In short it rings like a bell and produces an undesired resonance peak in the speaker frequency response where other materials such as plywood, particle board and PVC plastic have a damping effect and produce a flatter nonresonant response.

Another object of the present invention is to provide an air tight structure including a seal around the acoustic transducers so that the acoustic loading on the transducers is maintained during operation and the omnidirectionality is preserved. The frame components as described above are assembled and held in place in a holding jig after glue is applied to all edge surfaces to assure proper hemespherical shape and an air tight seal. A single quarter-inch hole is drilled in the structure for the electrical input wire and the transducers are installed using sealing gaskets or a sealing material such as RTV. The hole drilled for the electrical input wire is also sealed after the wire is in place.

Another object of the invention is to provide a speaker system of relatively small size with the acoustic output and frequency response of a speaker system many times its size and weight and to eliminate the need for a crossover network which contributes to phase errors and internal losses. Combining many small transducers into a housing does not increase the low frequency response of the system over that of any one unit even though the over all transducer surface area has increased many times, a woofer is needed with its large displacement excursion and cone surface area to extend the low frequency output along with a crossover network to electricaly separate and direct the range of frequencies required by both to maintain good efficiency.

The use of a small woofer such as the realistic 40-1022A four inch speaker which has an extremely long travel voice coil by itself displaces a limited amount of air at low frequencies and has poor low frequency response because of its lack of surface area. However, by combining several of this type of transducer in a housing and connecting them in phase the low frequency response is increased greatly because this new combination provides both large surface area and at the same time has large displacement excursion. Another advantage of the above transducer combination is that a crossover network is not needed since the small size of the individual transducer, four inches in this case, allows efficient operation at high frequencies and the combination of multiple transducers provides extended low frequency response from the same transducer.

The prefered embodiment is composed of a six sided hemisphere with a pentagonal shaped base plate. The six pentagonal surfaces which hold the transducers measure 4 inches on a side and have a 3¾ inch diameter hole in their centers. The triangular shaped gussets measure 7 3/16 in. by 4 7/16 in. by 4 7/16 in. The base plate in this case is a pentagonal shape measuring 8 in. On a side. Assembled, the structure measures 6 in. in height and fits into a base circle of 13.6 in. It is constructed of MDF high density particle board ½ in. thick. Completely assembled with transducers and speaker grills. The total weight is 13 lb. the sensitivity is 90 db for 1 watt at 1 meter and the power level at full output is 150 watts rms. The frequency response of the completed unit is 20 hz to 15 khz down 12 db at 20 hz and 15 khz.

DETAILED DESCRIPTION

Figure 1:
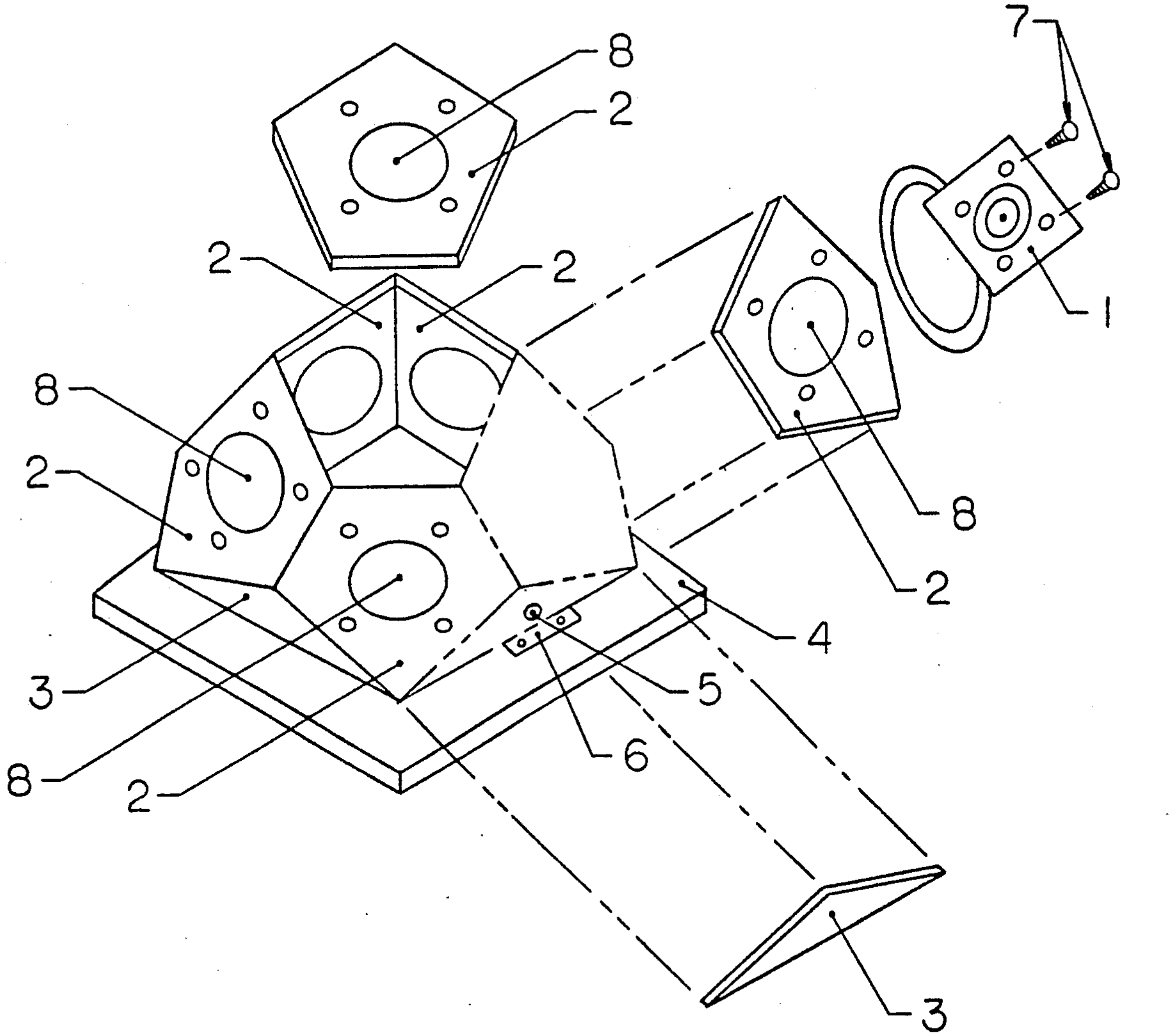
FIG. 1 is a partially exploded view of the prefered embodyment.

Referring now to the drawing FIG. 1 an illustration of the preferred embodiment of the present invention. This embodyment consisting of an assembly with six pentagonal shaped plates (2) each of which having five equal length sides which are beveled inward at an angle of 33 degrees with respect to the edge of the plate and each of which having a circular hole (8) cut around its center. Said plates being brought together at their beveled edges to form a six sided hemisphereical enclosure. The assembly also includes five triangular cut gussets (3) each having two inward beveled edges at an angle of 33 degrees with respect to its edge to mate with the two adjacent pentagonal shaped plates (2) and a third side beveled outward at an angle of 123 degrees to mate with the assembly baseplate (4). Each gusset also has a 108 degree angle and two base angles of 36 degrees each. In completed form the assembly becomes a six sided hemispherical dome shaped enclosure on a pentagonal base plate (4) having six surfaces (2) each of which maintaining an angle of 114 degrees with its adjacent neighbor and having a circular hole (8) cut to a size which serves as the mounting location for acoustic transducer (1) with said transducer being held in place by screws (7) with its cone facing outward. An access hole (5) in gusset (3) provides for passage into the closed assembly by an electrical wire to make electrical connection to the transducers. Said electrical wire at its outside end is terminated and connected to terminal block (6).

We claim:

1. An arrangement of divergently mounted acoustic transducers comprising:

a substantially air tight frame with the general shape of a polyhedron having six sides plus a base, said polyhedron being formed by bisecting a dodecahedron twelve sided polyhedron at its equitorial plane, a base plate closing the bottom of said frame, said base plate having a top surface and a bottom surface;

the six sides of said frame each having substantially identical equal-sided pentagonal shaped plates, said pentagonal shaped plates having their sides beveled at an angle of 33 degrees;

five substantially identical triangularly shaped gussets, each gusset having a 108 degree angle and two base angles of 36 degrees each, the two equal length sides of said gussets being beveled at an angle of 33 degrees to mate with their corresponding equal-sided pentagonal shaped plates, the remaining side of said triangularly shaped gussets being beveled at an angle of 123 degrees to mate with the top surface of said base plate; and an acoustic transducer mounted in each of said pentagonal shaped plates, said acoustic transducers being substantially identical and being electrically connected to operate in phase.

2. An arrangement of divergently mounted acoustic transducers as recited in claim 1 wherein said acoustic transducers have a diameter no greater than 4 inches in order to function efficiently at the high frequency end of the audio spectrum.

3. An arrangement of divergently mounted acoustic transducers as recited in claim 2 wherein said acoustic transducers have physical properties that give them a long travel voice coil such that the combined response of all said acoustic transducers at the low frequency end of the audio specturm when excited in phase in said air tight polyhedron frame is additive so that the low frequency produced is equal to that of a transducer having a larger diameter and greater surface area.

4. An arrangement of divergently mounted acoustic transducers as recited in claim 1 wherein the sides of said pentagonal shaped plates each measure 4 inches and they have a 3 3¾ inch diameter hole in their centers.

* * * * *